(12) United States Patent
Lee et al.

(10) Patent No.: US 12,418,995 B2
(45) Date of Patent: Sep. 16, 2025

(54) DISPLAY DEVICE

(71) Applicant: Samsung Display Co., LTD., Yongin-si (KR)

(72) Inventors: Jung Il Lee, Seoul (KR); Min-Sung Kim, Hwaseong-si (KR); Hyeong-Jun Kim, Suwon-si (KR); Saeyoung Hong, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 251 days.

(21) Appl. No.: 17/978,810

(22) Filed: Nov. 1, 2022

(65) Prior Publication Data

US 2023/0180405 A1  Jun. 8, 2023

(30) Foreign Application Priority Data

Nov. 8, 2021  (KR) .................. 10-2021-0152480

(51) Int. Cl.
    *H05K 5/00*   (2025.01)
    *H05K 5/02*   (2006.01)

(52) U.S. Cl.
    CPC ................... *H05K 5/0217* (2013.01)

(58) Field of Classification Search
    CPC . H05K 5/0217; G02F 1/133305; G09F 9/301; H10K 77/111; H10K 2102/311
    See application file for complete search history.

(56) References Cited

U.S. PATENT DOCUMENTS

| | | | | |
|---|---|---|---|---|
| 10,074,824 B2* | 9/2018 | Han | .............. | H10K 59/87 |
| 10,345,856 B2* | 7/2019 | Song | .............. | H05K 1/028 |
| 10,579,105 B2* | 3/2020 | Jones | .............. | G06F 1/1626 |
| 10,798,831 B2* | 10/2020 | Shin | .............. | H05K 5/0217 |
| 10,908,639 B2* | 2/2021 | Shibayama | .......... | G06F 1/1658 |
| 11,048,295 B1* | 6/2021 | Smeeton | .............. | G09F 9/301 |
| 11,153,980 B2* | 10/2021 | Hirakata | .............. | H05K 5/0086 |
| 11,256,295 B2* | 2/2022 | Lee | .............. | G09F 9/301 |
| 11,304,315 B2* | 4/2022 | Kim | .............. | H05K 5/03 |
| 11,662,771 B2* | 5/2023 | Kim | .............. | G06F 1/1652 361/679.01 |
| 11,678,514 B2* | 6/2023 | Zhou | .............. | H10K 59/12 257/4 |
| 11,758,752 B2* | 9/2023 | Hyun | .............. | H10K 59/871 257/88 |
| 11,812,565 B2* | 11/2023 | Seki | .............. | H05K 5/0217 |
| 11,841,746 B2* | 12/2023 | Kang | .............. | G06F 1/1652 |
| 11,893,912 B2* | 2/2024 | Cho | .............. | H10K 59/40 |

(Continued)

FOREIGN PATENT DOCUMENTS

| CN | 211928943 U | 11/2020 |
|---|---|---|
| KR | 10-2018-0079016 A | 7/2018 |

(Continued)

*Primary Examiner* — Rockshana D Chowdhury
(74) *Attorney, Agent, or Firm* — Womble Bond Dickinson (US) LLP

(57) ABSTRACT

A display device includes: a display module; and a plate on one side of the display module. The plate has a folding portion and a plurality of grooves in the folding portion. The grooves neighbor each other in a first direction and a second direction perpendicular to the first direction. A width of the groove in the first direction is in a range of 50 μm to 150 μm, and a length of the groove in the second direction is in a range of 2 mm to 4 mm.

15 Claims, 12 Drawing Sheets

(56) References Cited

U.S. PATENT DOCUMENTS

| | | | |
|---|---|---|---|
| 11,907,031 B2* | 2/2024 | Kim | G06F 1/1686 |
| 11,960,324 B2* | 4/2024 | Sun | G06F 1/1652 |
| 12,011,907 B2* | 6/2024 | Park | G09F 9/301 |
| 12,013,729 B2* | 6/2024 | Yang | G06F 1/1616 |
| 12,080,197 B2* | 9/2024 | Chen | G06F 1/1601 |
| 2015/0055287 A1* | 2/2015 | Seo | H04M 1/0268 |
| | | | 361/679.27 |
| 2016/0295685 A1* | 10/2016 | Ryu | G06F 1/1641 |
| 2017/0294495 A1* | 10/2017 | Shyu | H10K 77/111 |
| 2018/0097197 A1* | 4/2018 | Han | G06F 1/1626 |
| 2019/0067606 A1* | 2/2019 | Han | H10K 59/87 |
| 2019/0131553 A1* | 5/2019 | Park | G06F 1/1652 |
| 2019/0132947 A1* | 5/2019 | Koo | H05K 1/0281 |
| 2019/0207141 A1* | 7/2019 | Kim | H10K 59/8721 |
| 2019/0250665 A1* | 8/2019 | Kim | G06F 1/1652 |
| 2019/0265756 A1 | 8/2019 | Jones et al. | |
| 2021/0068276 A1* | 3/2021 | Kim | G06F 1/1681 |
| 2021/0076512 A1 | 3/2021 | Hirakata et al. | |
| 2021/0104694 A1* | 4/2021 | Yee | B32B 15/08 |
| 2021/0118337 A1* | 4/2021 | Park | G09F 9/301 |
| 2021/0165458 A1 | 6/2021 | Lee | |
| 2021/0168929 A1* | 6/2021 | Wang | H05K 1/028 |
| 2021/0174711 A1* | 6/2021 | Cho | H10K 59/10 |
| 2021/0325929 A1* | 10/2021 | Cai | B32B 3/04 |
| 2021/0382367 A1* | 12/2021 | Hashimoto | G06F 1/1652 |
| 2022/0174823 A1 | 6/2022 | Kim et al. | |
| 2022/0343809 A1* | 10/2022 | Chen | G06F 1/1656 |
| 2023/0164931 A1* | 5/2023 | Wang | G06F 1/1624 |
| | | | 361/807 |
| 2024/0281027 A1* | 8/2024 | Lee | G06F 1/1652 |

FOREIGN PATENT DOCUMENTS

| | | |
|---|---|---|
| KR | 10-2020-0052643 A | 5/2020 |
| KR | 10-2020-0069799 A | 6/2020 |
| KR | 10-2022-0077953 A | 6/2022 |

* cited by examiner

DISPLAY DEVICE

CROSS-REFERENCE TO RELATED APPLICATION

This application claims priority to and the benefit of Korean Patent Application No. 10-2021-0152480, filed in the Korean Intellectual Property Office on Nov. 8, 2021, the entire content of which is incorporated herein by reference.

BACKGROUND

1. Field

Aspects of embodiments of the present disclosure relate to a display device.

2. Description of the Related Art

As information technology has developed, display devices, which are a connection medium between a user and information, have become increasingly important.

Recently, research and development of foldable display devices, bendable display devices, and/or rollable display devices using bendable or foldable flexible display panels has progressed. The display devices are applicable to various fields of electronic products, such as televisions or monitors as well as portable electronic devices and wearable devices.

Portable electronic devices, such as smartphones or tablet PCs, are becoming lighter and slimmer for increased portability and are being developed in many ways for convenient use. For example, a foldable electronic device including a flexible display provides a relatively wide screen compared to a bar-type electronic device, and its size is reduced when it is folded to provide better portability. Therefore, the foldable electronic device has gained the spotlight as an electronic device for satisfying consumers' taste.

The above information disclosed in this Background section is for enhancement of understanding of the background of the present disclosure, and therefore, it may contain information that does not form the prior art that is already known to a person of ordinary skill in the art.

SUMMARY

Aspects of embodiments of the present disclosure provide a display device having improved impact resistance at a folding portion.

An embodiment of the present disclosure provides a display device including: a display module; and a plate on one side of the display module. The plate has a folding portion and a plurality of grooves in the folding portion. The grooves neighbor each other in a first direction and a second direction perpendicular to the first direction. A width of the groove in the first direction is in a range of 50 μm to 150 μm, and a length of the groove in the second direction is in a range of 2 mm to 4 mm.

An elasticity coefficient of the folding portion may be in a range of 0.5 MPa to 50 MPa.

A distance from among the grooves neighboring in the first direction may be in a range of 100 μm to 200 μm.

A distance from among the grooves neighboring in the second direction may be in a range of 150 μm to 300 μm.

The display device may be configured to be folded with respect to the second direction.

The display device may further include a protection member between the display module and the plate. The protection member may not include a groove at a position overlapping the folding portion.

The plate may include reinforced plastic.

Another embodiment of the present disclosure provides a display device including: a display module; and a plate on one side of the display module. The plate has a first folding portion and a second folding portion and a plurality of grooves in each of the first and second folding portions. The grooves neighbor each other in a first direction and a second direction perpendicular to the first direction, and a width of the groove in the first direction is in a range of 50 μm to 150 μm.

A folding direction of the first folding portion may be opposite to a folding direction of the second folding portion.

The first folding portion may be configured to be folded in a direction so that a displaying side of the display module becomes concave, and the second folding portion may be configured to be folded in a direction so that a displaying side of the display module becomes convex.

The first folding portion may have a lesser curvature than the second folding portion.

The first folding portion may have a lesser elasticity coefficient than the second folding portion.

An elasticity coefficient of the first folding portion may be in a range of 0.5 MPa to 10 MPa.

An elasticity coefficient of the second folding portion may be in a range of 0.5 MPa to 50 MPa.

A width of one of the grooves in the first folding portion in the first direction may be less than a width of one of the grooves in the second folding portion in the first direction.

A length of the groove in the second direction may be in a range of 2 mm to 4 mm.

A distance from among the grooves neighboring in the first direction may be in a range of 100 μm to 200 μm.

A distance from among the grooves neighboring in the second direction may be in a range of 150 μm to 300 μm.

The plate may have a third folding portion and a plurality of grooves in the third folding portion. The first folding portion and the third folding portion may be configured to be folded in a same direction.

The plate may have a fourth folding portion and a plurality of grooves in the fourth folding portion. The second folding portion and the fourth folding portion may be configured to be folded in the same direction.

According to embodiments of the present disclosure, a display device having improved impact resistance at the folding portion is provided.

DETAILED DESCRIPTION

Figure 1:
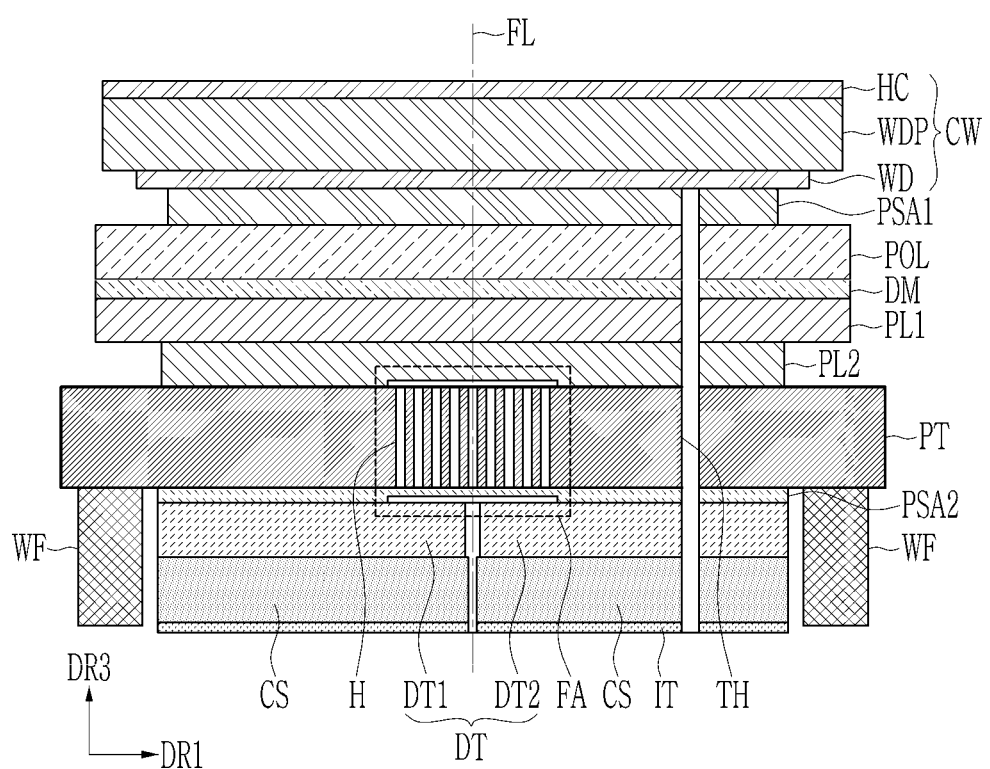
FIG. 1 shows a cross-sectional view of a display device according to an embodiment.

The present disclosure will be described more fully hereinafter with reference to the accompanying drawings, in which embodiments of the present disclosure are shown. As those skilled in the art would realize, the described embodiments may be modified in various different ways, all without departing from the spirit or scope of the present disclosure.

Aspects and features of the described embodiments that are irrelevant to the description may be omitted to more clearly describe the present disclosure, and the same elements will be designated by the same reference numerals throughout the specification.

The size and thickness of each configuration shown in the drawings may be arbitrarily shown for better understanding and ease of description, and the present disclosure is not limited thereto. For example, the thickness of layers, films, panels, regions, etc. may be enlarged for clarity.

It will be understood that when an element, such as a layer, film, region, or substrate, is referred to as being "on," "connected to," or "coupled to" another element, it can be directly on, connected to, or coupled to the other element or intervening elements may also be present. When an element is referred to as being "directly on," "directly connected to," or "directly coupled to" another element, no intervening elements are present. The word "on" or "above" means positioned on or below the object portion but does not necessarily mean positioned on the upper side of the object portion based on a gravitational direction.

Unless explicitly described to the contrary, the words "have," "include," and "comprise" and variations, such as "has, "having," "includes," "including," "comprises," or "comprising," will be understood to imply the inclusion of stated elements but not the exclusion of any other elements.

The phrase "in a plan view" means viewing an object portion from the top, and the phrase "in a cross-sectional view" means viewing a cross-section of which the object portion is vertically cut from the side.

A display device according to an embodiment will now be described with reference to accompanying drawings.

FIG. 1 shows a cross-sectional view of a display device according to an embodiment. Referring to FIG. 1, the display device may include a display module (DM), a cover window (CW) positioned on an upper side of the display module (DM), a polarization layer (POL), a first protection member (PL1), a second protection member (PL2), a plate (PT), a digitizer (DT), a cushion layer (CS), an insulating layer (IT), and adhesive layers (PSA1 and PSA2).

The cover window (CW) may include a window (WD), a window protection member (WDP), and a hard coating layer (HC). The window (WD) may include (or may be made of) glass. However, the present disclosure is not limited thereto. The window (WD) may include (or may be made of) a polymer resin.

The window protection member (WDP) may be disposed on an upper side of the window (WD). The window protection member (WDP) may protect the window (WD) from external impacts and may prevent or reduce scratches from forming on the upper side of the window (WD). The window protection member (WDP) may include (or may be made of) a polymer resin. However, the present disclosure is not limited thereto. The window protection member (WDP) may include (or may be made of) an inorganic material.

The hard coating layer (HC) may be positioned on an upper side of the window protection member (WDP). The hard coating layer (HC) may include (or may be made of) an organic material, such as a polymer resin. However, the present disclosure is not limited thereto. The hard coating layer (HC) may include (or may be made of) an inorganic material.

The polarization layer (POL) may be positioned on an upper side of the display module (DM). The polarization layer (POL) may be omitted depending on embodiments. The polarization layer (POL) may be attached to the cover window (CW) by a first adhesive layers (PSA1). The first adhesive layers (PSA1) may be a pressure sensitive adhesive. However, the present disclosure is not limited thereto.

The first protection member (PL1) may be disposed on a lower side of the display module (DM). The first protection member (PL1) may be disposed on a lower side of the display module (DM) to support the display module (DM) and protect the display module (DM) from external impacts. The first protection member (PL1) may include (or may be made of) a polymer resin, such as polyethylene terephthalate or polyimide.

The second protection member (PL2) may be disposed on a lower side of the first protection member (PL1). The second protection member (PL2) may be positioned on the lower side of the display module (DM) and may support the display module (DM). The second protection member (PL2) may include (or may be made of) a polymer resin, such as polyethylene terephthalate or polyimide.

The plate (PT) may be positioned on a lower side of the second protection member (PL2). The plate (PT) has a folding area (FA), and a plurality of grooves (H) are formed in the folding area (FA).

The plate (PT) may include (or may be made of) a metal or reinforced plastic. For example, the plate (PT) may include (or may be made of) carbon fiber reinforced plastic. The plate (PT) may be multi-layered, and carbon fiber reinforced plastic and glass fiber reinforced plastic may be alternately stacked.

The plate (PT) may be positioned on the lower side of the display module (DM) and may support the display module (DM). The plate (PT) may also be positioned on the upper side of the digitizer (DT) to protect the digitizer (DT) from external impacts.

The plate (PT) may include a plurality of grooves (H). The plate (PT) may be folded by (or at) the groove (H) with respect to the folding axis (FL). For example, when the display device is folded, the plate (PT) may be folded with respect to the folding axis (FL). The plate (PT), other than the area at where the groove (H) are present, may have a planar upper side (or upper surface). A detailed shape of the groove (H) will be described later.

The digitizer (DT) may be positioned on a lower side of the plate (PT). The digitizer (DT) may include a body layer and/or a pattern layer. The digitizer (DT) may sense signals input from an external electronic pen through the pattern layer. For example, the digitizer (DT) may sense intensities and directions of the signals input from the electronic pen. The digitizer (DT) may be attached to the plate (PT) by the second adhesive layer (PSA2).

When the digitizer (DT) is integrally formed and the display device is folded, the body layer and/or the pattern layer of the digitizer (DT) may crack. The digitizer (DT) may include a first digitizer (DT1) positioned on a left side of the folding axis (FL) and a second digitizer (DT2) positioned on a right side of the folding axis (FL).

The first digitizer (DT1) and the second digitizer (DT2) may be spaced from each other in a first direction (DR1) with the folding axis (FL) therebetween. For example, the digitizer (DT) may be made not integrated but separated. Because the digitizer (DT) has a separated structure, elements or components at the folding area (FA) may not crack (e.g., the digitizer (DT) may not crack).

In addition, the digitizer (DT) is provided as a separated type and overlaps part of the folding area (FA) so that it may receive signals in the folding area (FA), and convenience of a user may be improved.

The cushion layer (CS) may be disposed on a lower side of the digitizer (DT). The cushion layer (CS) may prevent or minimize the digitizer (DT) disposed on the cushion layer (CS) from being damaged by the external impacts. The insulating layer (IT) may be positioned on a lower side of the cushion layer (CS). The insulating layer (IT) may include (or may be made of) an insulating tape.

A waterproof member (WF) may be disposed on an outside of the cushion layer (CS). The waterproof member (WF) may block or absorb moisture from the outside of the display device to prevent or minimize components of the display device from being damaged by moisture. The waterproof member (WF) may include (or may be made of) a tape or a sponge.

The first adhesive layers (PSA1), the polarization layer (POL), the display panel (DM), the first protection member (PL1), the second protection member (PL2), the plate (PT), the second adhesive layers (PSA2), the digitizer (DT), the cushion layer (CS), and the insulating layer (IT) may have openings (or through-holes (TH)). Light transmittance of the corresponding region may be increased by the through-holes (TH).

Because the plate (PT) includes the groove (H) at the folding portion (FA), the display device may be easily bent. However, the groove (H) of the plate (PT) may be weak in impact resistance.

Table 1 shows results obtained by performing a pen drop test and a ball drop test to a planar area of the display device and a folding area in which the groove (H) is formed in the plate (PT).

TABLE 1

|  | Planar area (Flat) | Folding area (Pattern) |
|---|---|---|
| Pen drop | 8 cm | 4 cm |
| Ball drop | 8 cm | 4 cm |

Figure 2:
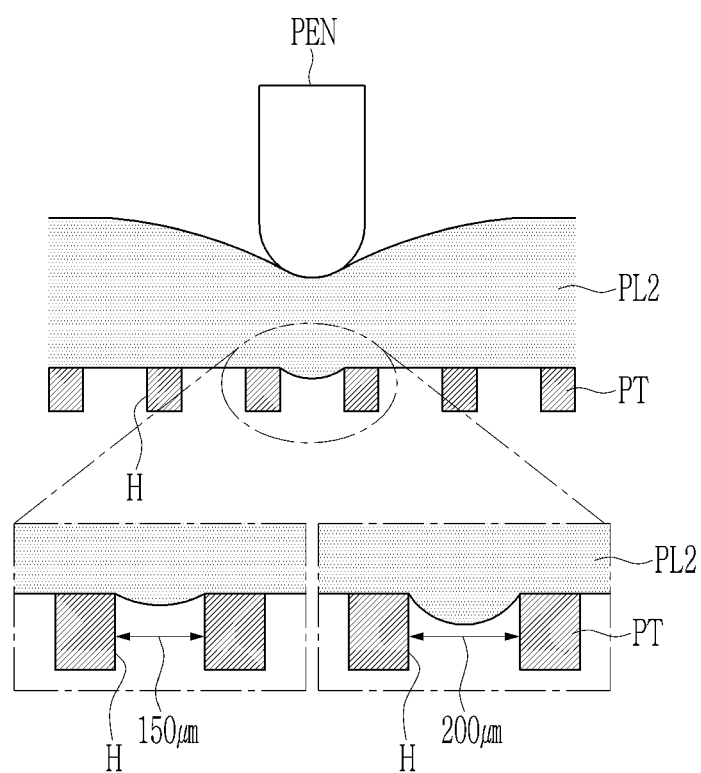
FIG. 2 shows movement when a pen drop test is performed in a groove region of a plate.

As can be seen from Table 1, the folding portion is relatively weak in impact resistance compared to the planar portion. This is because the stress is focused in the groove (H). FIG. 2 shows movement when a pen drop test is performed in a groove region (H) of a plate (PT). Referring to FIG. 2, impacts are focused in the groove (H) when the pen, which has a diameter of 0.3 mm, is dropped. The impacts depend on the width of the groove (H) in which the stress is focused.

In FIG. 2, the widths of the grooves (H) are 150 μm and 200 μm, respectively, of degrees of stresses concentrated therein. Referring to FIG. 2, it is found that further stresses are focused when the groove (H) has a greater width.

The display device according to the present embodiment has improved impact resistance by adjusting the width of the groove (H) to satisfy an optimal range.

Figure 3:
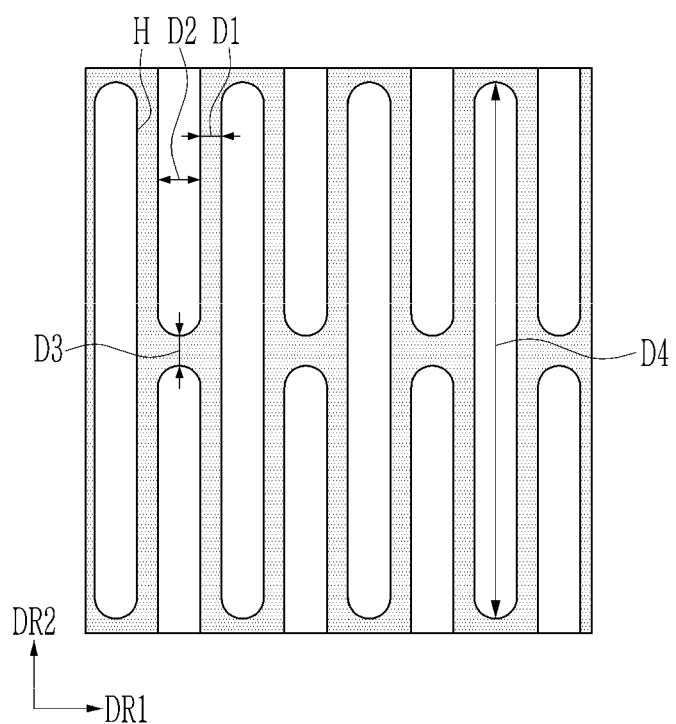
FIG. 3 shows a plurality of grooves disposed in a folding area of a plate shown in FIG. 1.

FIG. 3 shows a plurality of grooves (H) disposed in the folding area (FA) of the plate (PT) shown in FIG. 1. Referring to FIG. 3, the groove (H) is positioned as a long bar type in (e.g., extending in) a second direction (DR2), and a plurality of grooves (H) may be positioned to neighbor each other in (e.g., may be adjacent to each other in) the first direction (DR1) and the second direction (DR2).

A spaced distance between neighboring grooves (H) in the first direction (DR1) is given as D1, a width of the groove (H) in the first direction (DR1) is given as D2, a spaced distance between neighboring grooves (H) in the second direction is given as D3, and a length of the groove (H) in the second direction (DR2) is given as D4. The width (D2) of the groove (H) will represent a length of a short portion of the groove (H) (e.g., a width of the groove (H)), and the length (D4) of the groove (H) will denote a length of a long portion of the groove (H).

The impact resistance is tested by changing the lengths of D1, D2, D3, and D4 through the experimental examples 1 to 6. The impact resistance test includes dropping a pen with the diameter of 0.3 mm on the display device at various heights and measuring the height from which the display device is damaged.

The lengths of D1, D2, D3, and D4 according to the experimental examples 1 to 4 are expressed in Table 2.

TABLE 2

| (mm) | Experimental Example 1 | Experimental Example 2 | Experimental Example 3 | Experimental Example 4 | Experimental Example 5 | Experimental Example 6 |
|---|---|---|---|---|---|---|
| D1 | 0.1 | 0.2 | 0.1 | 0.1 | 0.1 | 0.1 |
| D2 | 0.2 | 0.2 | 0.15 | 0.6 | 0.2 | 0.2 |
| D3 | 0.15 | 0.15 | 0.15 | 0.15 | 0.3 | 0.15 |
| D4 | 4 | 4 | 4 | 4 | 4 | 2 |
| Comparison targets | Reference values | D1 | D2 | D2 | D3 | D4 |

Figure 4:
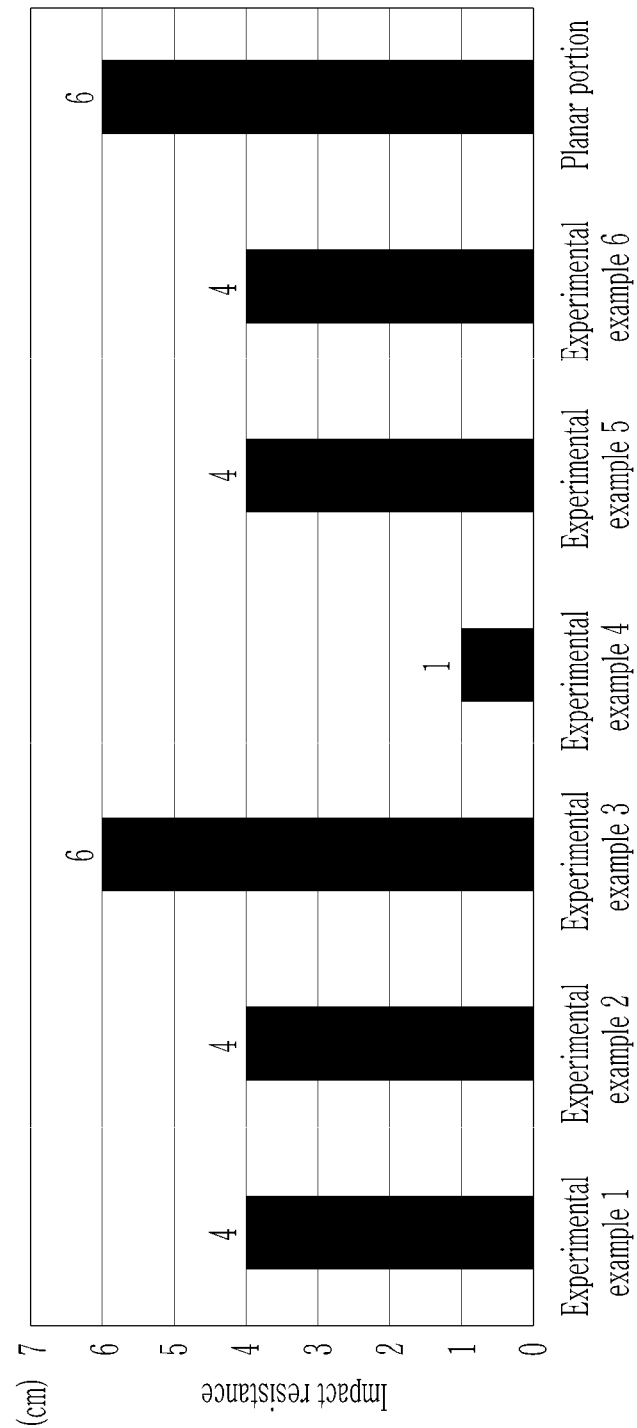
FIG. 4 is a graph showing impact resistance test results of experimental examples 1 to 6.

Impact resistance test results according to the experimental examples 1 to 6 are shown in FIG. 4. Referring to FIG. 4, it is found that the impact resistance is changed when the width (D2) of the groove (H) in the first direction (DR1) is changed. That is, the impact resistance is significantly changed in the experimental example 3 and the experimental example 4 in which the width (D2) of the groove (H) in the first direction (DR1) is changed, and no meaningful changes of the impact resistance are found from the changes of other lengths. It is thus found that the most important factor influencing the impact resistance is the width (D2) of the groove (H). Hence, the impact resistance is measured by changing the width (D2) of the groove (H) while fixing other lengths. Estimation is performed according to the experimental examples 5, 6, and 7, and numerical values of D1 to D4 according to respective experimental examples are as expressed in Table 3.

TABLE 3

| (mm) | Experimental Example 5 | Experimental Example 6 | Experimental Example 7 |
|---|---|---|---|
| D1 | 0.13 | 0.13 | 0.13 |
| D2 | 0.2 | 0.17 | 0.14 |
| D3 | 0.15 | 0.15 | 0.15 |
| D4 | 4 | 4 | 4 |

Pen drop tests are performed for the experimental examples 5, 6, and 7, and corresponding results are expressed in Table 4.

TABLE 4

| | | | Estimation results | | |
|---|---|---|---|---|---|
| Classification | Estimation items | Estimation conditions | Experimental Example 5 | Experimental Example 6 | Experimental Example 7 |
| Base plates | Pen Drop | Bright spots | 4 cm | 6 cm | 8 cm |

Figure 5:
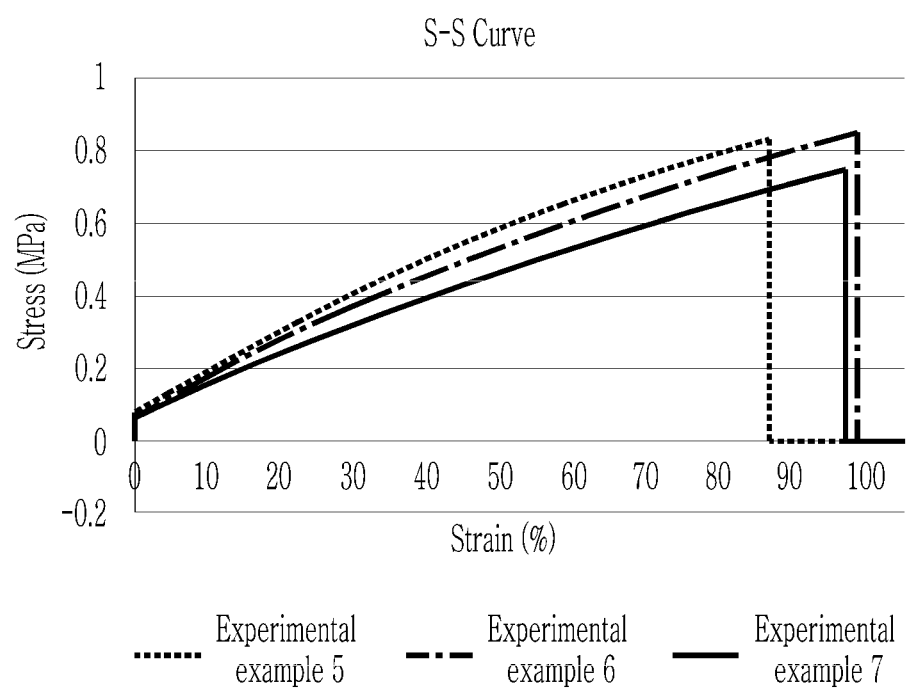
FIG. 5 is a stress-strain curve according to experimental examples 5, 6, and 7.

It is found from Table 3 and Table 4 that the impact resistance increases as the width (D2) of the groove (H) is reduced. However, processability is degraded when the width (D2) of the groove (H) is excessively reduced. Therefore, it is desirable for the width (D2) of the groove (H) considering processability and impact resistance to be in a range of about 50 µm to about 150 µm. Processing may be difficult when the width (D2) of the groove (H) is less than about 50 µm. When the width (D2) of the groove (H) is greater than about 150 µm, impact resistance is reduced, which is undesirable. FIG. 5 shows a stress-strain curve according to the experimental examples 5, 6, and 7. Table 5 shows results obtained by measuring elasticity coefficients of a folding portion of a plate according to the experimental examples 5, 6, and 7 based on the stress-strain curve shown in FIG. 5. The elasticity coefficient values of Table 5 are mean (or average) values of five sheets after the test is repeated for the five sheets.

TABLE 5

| | Modulus (MPa) | Notes |
|---|---|---|
| Experimental Example 5 | 1.19 | Mean of five sheets |
| Experimental Example 6 | 1.08 | Mean of five sheets |
| Experimental Example 7 | 0.90 | Mean of five sheets |

Referring to Table 5 and FIG. 5, when the width (D2) of the groove (H) is reduced, the modulus is 1 MPa, which does not influence folding reliability. That is, the display device may be well (or easily) folded when the groove (H) is formed in the folding area (FA) of the plate (PT). When the width (D2) of the groove (H) is in the range of about 50 µm to about 150 µm, the groove (H) is easily processed, folding reliability is obtained, and impact resistance of the display device may be improved.

FIG. 1 shows the configuration having one folding area (FA), but in another embodiment, e two or more folding areas (FA) may be present, and the display device may be folded a plurality of times.

Figure 6:
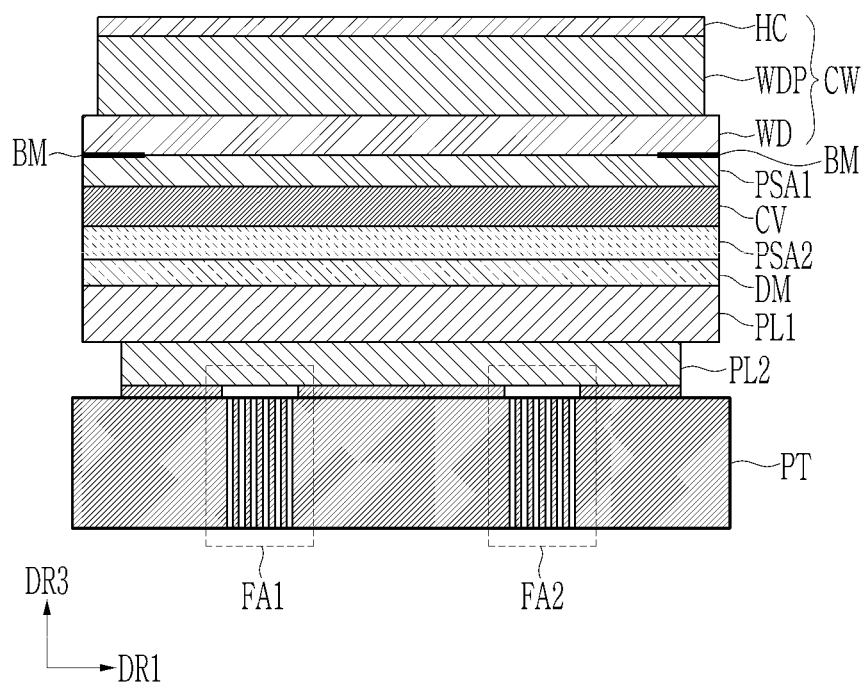
FIG. 6 shows a cross-section of a display device according to another embodiment.

FIG. 6 shows a cross-section of a display device according to another embodiment. FIG. 6 includes a cover window (CW), an impact absorbing layer (CV), a display module (DM), a first protection member (DP1), a second protection member (DP2), and a plate (PT). Descriptions of the cover window (CW), the display module (DM), the first protection member (DP1), and the second protection member (DP2) correspond to what was described above with reference to FIG. 1 and will be described again. That is, the content described above with reference to FIG. 1 is applied in a like way to the embodiment shown in FIG. 6.

Referring to FIG. 6, the display device includes an impact absorbing layer (CV) and omits the polarization layer (POL). The impact absorbing layer (CV) may be positioned between the cover window (CW) and the display module (DM). The impact absorbing layer (CV) may be attached to the cover window (CW) by the first adhesive layers (PSA1) and may be attached to the display module (DM) by the second adhesive layers (PSA2). The impact absorbing layer (CV) may include (or may be made of) a polymer resin, such as polyethylene terephthalate or polyimide.

A light blocking layer (BM) may be positioned on a lower side of the cover window (CW). The light blocking layer (BM) may overlap part of the cover window (CW) and may cover a wire. The light blocking layer (BM) may be omitted depending on embodiments.

The plate (PT) may have a first folding portion (FA1) and a second folding portion (FA2). The first folding portion (FA1) and the second folding portion (FA2) may respectively include a groove (H). The elasticity coefficients of the first folding portion (FA1) and the second folding portion (FA2) may be different from each other. For example, the elasticity coefficient of the first folding portion (FA1) may be in a range of about 0.5 MPa to about 10 MPa, and the elasticity coefficient of the second folding portion (FA2) may be in a range of about 0.5 MPa to about 50 MPa. The first folding portion (FA1) may be an in-folding area of which the displaying side is concave, and the second folding portion (FA2) may be an out-folding area of which the displaying side is convex.

Figure 7:
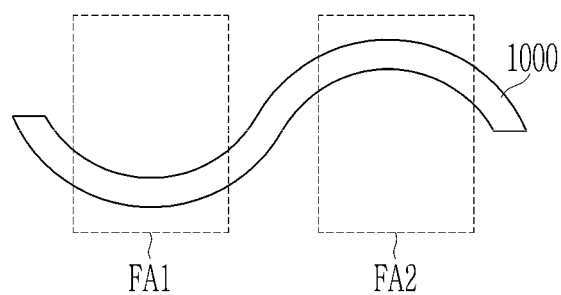
FIG. 7 shows the display device shown in FIG. 6 in a folded state.

FIG. 7 shows the display device shown in FIG. 6 in a folded state. Referring to FIG. 7, the display device 1000 is bent in an in-folding way at the first folding portion (FA1) and is bent in an out-folding way at the second folding portion (FA2). A curvature of the first folding portion (FA1) may be less than a curvature of the second folding portion (FA2), because the displaying side is further bent in the case of in-folding as shown in, for example, FIG. 7. For example, the first folding portion (FA1) may have a curvature of about 2.5R, and the second folding portion (FA2) may have a curvature of about 4R.

Because the second folding portion (FA2) has a greater curvature than the first folding portion (FA1), the second folding portion (FA2) may have a greater elasticity coefficient than the first folding portion (FA1). As the elasticity coefficient increases, a possibility of defects during the folding increases, ad particularly, when the display device is folded with a small curvature. Thus, a small elasticity coefficient is desired. The second folding portion (FA2) is folded with the greater curvature than the first folding portion (FA1), so when the former has a higher elasticity coefficient than the latter, this may not have any (or may not have any significant) influence to the folding reliability.

The width (D2) of the groove (H) positioned in the second folding portion (FA2) may be greater than the width (D2) of the groove (H) positioned in the first folding portion (FA1). As shown in Table 5, the elasticity coefficient is reduced as the width (D2) of the groove (H) is reduced. Thus, when the groove (H) is small, a number of the grooves (H) per area increases, and the increased number of the grooves (H) per area reduce the elasticity coefficient. The elasticity coefficient of the second folding portion (FA2) may be greater than the elasticity coefficient of the first folding portion (FA1), and hence, the width (D2) of the groove (H) of the second folding portion (FA2) may be greater than the width (D2) of the groove (H) of the first folding portion (FA1).

Figure 8:
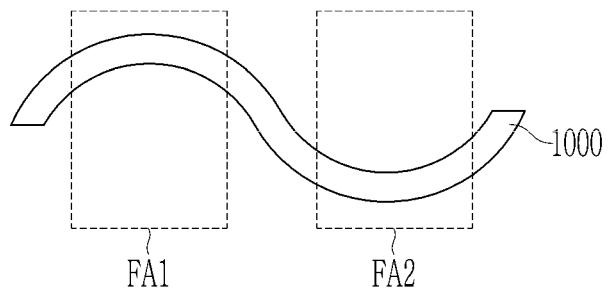
FIG. 8 shows the display device show in FIG. 6 in another folded state.

FIG. 6 and FIG. 7 show that the first folding portion (FA1) is in-folded and the second folding portion (FA2) is out-folded, but the present disclosure is not limited thereto. For example, as shown in FIG. 8, the first folding portion (FA1) may be out-folded and the second folding portion (FA2) may be in-folded, and in this case, the elasticity coefficient of the first folding portion (FA1) may be in the range of about 0.5 MPa to about 50 MPa, and the elasticity coefficient of the second folding portion (FA2) may be in the range of about 0.5 MPa to about 10 MPa. The first folding portion (FA1) may have a greater elasticity coefficient than the second folding portion (FA2).

FIG. 6 to FIG. 8 show the display device 1000 in two folding states (or portions), but a display device according to embodiments may have three or more folding portions.

Figure 9:
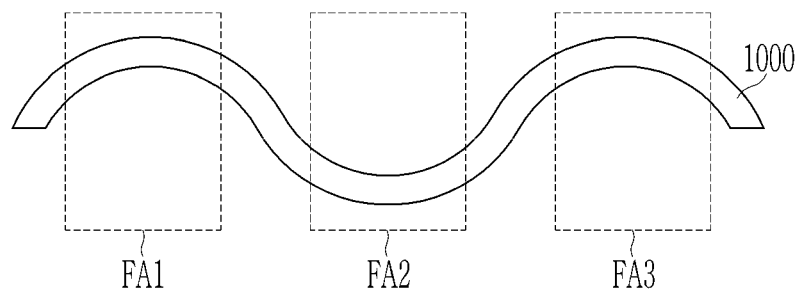
FIGS. 9 to 12 show a display device according to another embodiment.

FIG. 9 shows a display device according to another embodiment. Referring to FIG. 9, the display device 1000 may have a first folding portion (FA1), a second folding portion (FA2), and a third folding portion (FA3). The first folding portion (FA1) and the third folding portion (FA3) may be out-folded and the second folding portion (FA2) may be in-folded. The respective folding portions may include a plurality of grooves positioned in the plate. Descriptions on the in-folding portion, the out-folding portion, and the groove correspond to what have been described in the above and will not be described again. For example, the out-folding portion may have a greater elasticity coefficient than the in-folding portion. The elasticity coefficient of the in-folding portion may be in the range of about 0.5 MPa to about 10 MPa, and the elasticity coefficient of the out-folding portion may be in the range of about 0.5 MPa to about 50 MPa.

Figure 10:
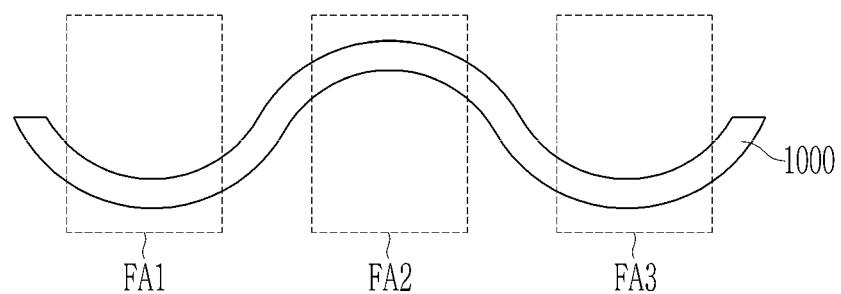

FIG. 10 shows a display device according to another embodiment. Referring to FIG. 10, the display device 1000 may have a first folding portion (FA1), a second folding portion (FA2), and a third folding portion (FA3). The first folding portion (FA1) and the third folding portion (FA3) may be in-folded, and the second folding portion (FA2) may be out-folded. The respective folding portions may include a plurality of grooves positioned in the plate. Descriptions on the in-folding portion, the out-folding portion, and the groove correspond to what have been described in the above and will not be described again. For example, the out-folding portion may have a greater elasticity coefficient than the in-folding portion. The elasticity coefficient of the in-folding portion may be in the range of about 0.5 MPa to about 10 MPa, and the elasticity coefficient of the out-folding portion may be in the range of about 0.5 MPa to about 50 MPa.

Figure 11:
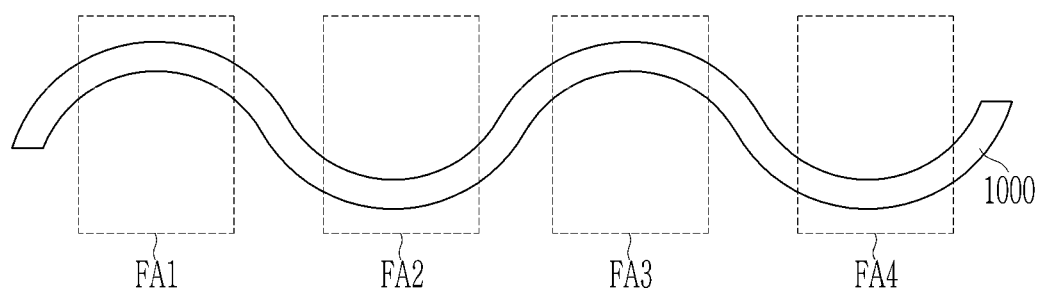

FIG. 11 shows a display device according to another embodiment. Referring to FIG. 11, the display device 1000 may have a first folding portion (FA1), a second folding portion (FA2), a third folding portion (FA3), and a fourth folding portion (FA4). The first folding portion (FA1) and the third folding portion (FA3) may be out-folded, and the second folding portion (FA2) and the fourth folding portion (FA4) may be in-folded. The respective folding portions may include a plurality of grooves positioned in the plate. Descriptions on the in-folding portion, the out-folding portion, and the groove correspond to what have been described in the above and will not be described again. For example, the out-folding portion may have a greater elasticity coefficient than the in-folding portion. The elasticity coefficient of the in-folding portion may be in the range of about 0.5 MPa to about 10 MPa, and the elasticity coefficient of the out-folding portion may be in the range of about 0.5 MPa to about 50 MPa.

Figure 12:
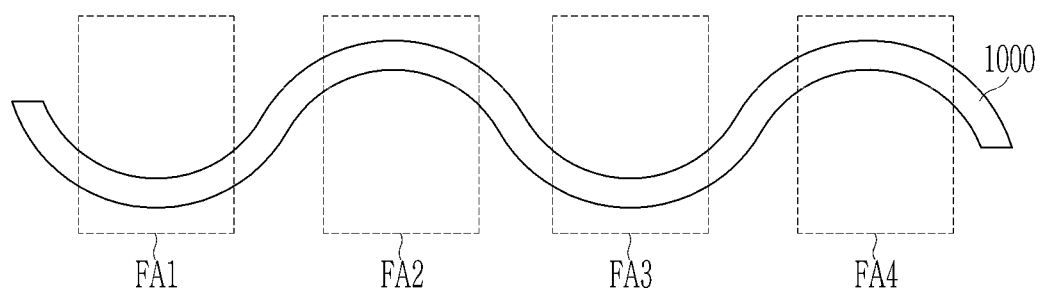

FIG. 12 shows a display device according to another embodiment. Referring to FIG. 12, the display device 1000 may have a first folding portion (FA1), a second folding portion (FA2), a third folding portion (FA3), and a fourth folding portion (FA4). The first folding portion (FA1) and the third folding portion (FA3) may be in-folded, and the second folding portion (FA2) and the fourth folding portion (FA4) may be out-folded. The respective folding portions may include a plurality of grooves positioned in the plate. Descriptions on the in-folding portion, the out-folding portion, and the groove correspond to what have been described in the above and will not be described again. For example, the out-folding portion may have a greater elasticity coefficient than the in-folding portion. The elasticity coefficient of the in-folding portion may be in the range of about 0.5 MPa to about 10 MPa, and the elasticity coefficient of the out-folding portion may be in the range of about 0.5 MPa to about 50 MPa.

While the present disclosure has been described in connection with what is presently considered to be practical embodiments, it is to be understood that the present disclosure is not limited to the disclosed embodiments. The present disclosure is intended to cover various modifications and equivalent arrangements included within the spirit and scope of the appended claims and their equivalents.

| Description of Some Reference Symbols | |
|---|---|
| 1000: display device | H: groove |
| PT: plate | DM: display module |

What is claimed is:

1. A display device comprising:
   a display module; and
   a plate on one side of the display module, the plate having a folding portion and a plurality of grooves in the folding portion,
   wherein the grooves neighbor each other in a first direction and a second direction perpendicular to the first direction,
   wherein a width of the groove in the first direction is in a range of 50 μm to 150 μm,
   wherein a length of the groove in the second direction is in a range of 2 mm to 4 mm, and
   wherein an elasticity coefficient of the folding portion is in a range of 0.5 MPa to 50 MPa.

2. The display device of claim 1, wherein a distance from among the grooves neighboring in the first direction is in a range of 100 μm to 200 μm.

3. The display device of claim 1, wherein a distance from among the grooves neighboring in the second direction is in a range of 150 μm to 300 μm.

4. The display device of claim 1, wherein the display device is configured to be folded with respect to the second direction.

5. The display device of claim 1, further comprising a protection member between the display module and the plate,
   wherein the protection member does not include a groove at a position overlapping the folding portion.

6. The display device of claim 1, wherein the plate comprises reinforced plastic.

7. A display device comprising:
a display module; and
a plate on one side of the display module, the plate has a first folding portion and a second folding portion and a plurality of grooves in each of the first and second folding portions,
wherein the first folding portion is configured to be folded in a direction so that a displaying side of the display module becomes concave,
wherein the second folding portion is configured to be folded in a direction so that a displaying side of the display module becomes convex,
wherein the grooves neighbor each other in a first direction and a second direction perpendicular to the first direction,
wherein a width of the groove in the first direction is in a range of 50 μm to 150 μm,
wherein an elasticity coefficient of the first folding portion is in a range of 0.5 MPa to 10 MPa,
wherein an elasticity coefficient of the second folding portion is in a range of 0.5 MPa to 50 MPa, and
wherein the first folding portion has a lesser elasticity coefficient than the second folding portion.

8. The display device of claim 7, wherein a folding direction of the first folding portion is opposite to a folding direction of the second folding portion.

9. The display device of claim 7, wherein the first folding portion has a lesser curvature than the second folding portion.

10. The display device of claim 7, wherein a width of one of the grooves in the first folding portion in the first direction is less than a width of one of the grooves in the second folding portion in the first direction.

11. The display device of claim 7, wherein a length of the groove in the second direction is in a range of 2 mm to 4 mm.

12. The display device of claim 7, wherein a distance from among the grooves neighboring in the first direction is in a range of 100 μm to 200 μm.

13. The display device of claim 7, wherein a distance from among the grooves neighboring in the second direction is in a range of 150 μm to 300 μm.

14. The display device of claim 7, wherein the plate has a third folding portion and a plurality of grooves in the first folding portion, and
wherein the first folding portion and the third folding portion are configured to be folded in a same direction.

15. The display device of claim 14, wherein the plate has a fourth folding portion and a plurality of grooves in the fourth folding portion, and
wherein the second folding portion and the fourth folding portion are configured to be folded in the same direction.

* * * * *